(12) United States Patent
Yu et al.

(10) Patent No.: US 8,328,300 B2
(45) Date of Patent: Dec. 11, 2012

(54) MOUNTING APPARATUS FOR SLIDE RAIL

(75) Inventors: Mo-Ming Yu, Shenzhen (CN); Ze-Hong Chen, Shenzhen (CN); Guang-Hua Gu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 168 days.

(21) Appl. No.: 12/796,644

(22) Filed: Jun. 8, 2010

(65) Prior Publication Data

US 2011/0240580 A1    Oct. 6, 2011

(30) Foreign Application Priority Data

Apr. 6, 2010 (CN) .......................... 2010 1 0139822

(51) Int. Cl.
*A47B 88/04* (2006.01)

(52) U.S. Cl. .................................... 312/333; 312/334.4

(58) Field of Classification Search .................. 312/333, 312/334.1, 334.4, 334.7, 319.1, 334.44, 334.45, 312/334.46, 334.47; 211/26, 192, 126.15; 248/220.41, 220.21, 220.22, 221.11, 222.14, 248/244
See application file for complete search history.

(56) References Cited

U.S. PATENT DOCUMENTS

| | | | | |
|---|---|---|---|---|
| 6,702,124 B2 * | 3/2004 | Lauchner et al. | ............... | 211/26 |
| 7,281,694 B2 * | 10/2007 | Allen et al. | .................... | 248/244 |
| 7,284,672 B2 * | 10/2007 | Tsai | .............................. | 211/208 |
| 7,357,362 B2 * | 4/2008 | Yang et al. | ............... | 248/221.11 |
| 7,364,244 B2 * | 4/2008 | Sandoval | ....................... | 312/333 |
| 7,740,329 B2 * | 6/2010 | Hsiung et al. | .............. | 312/334.4 |
| 7,744,177 B2 * | 6/2010 | Peng et al. | ................. | 312/334.4 |
| 2004/0016712 A1 * | 1/2004 | Hamilton | ....................... | 211/134 |
| 2008/0122333 A1 * | 5/2008 | Tseng et al. | ................... | 312/333 |
| 2009/0283652 A1 * | 11/2009 | Chen et al. | ................. | 248/298.1 |
| 2010/0194252 A1 * | 8/2010 | Liang | ......................... | 312/223.2 |

* cited by examiner

*Primary Examiner* — James O Hansen
*Assistant Examiner* — Matthew Ing
(74) *Attorney, Agent, or Firm* — Altis Law Group, Inc.

(57) ABSTRACT

A mounting apparatus is provided for mounting a slide rail to a rack post defining a number of through holes. The mounting apparatus includes a mounting bracket and a clipping member. The mounting bracket includes a sliding portion slidably engaged with the slide rail and an end plate perpendicularly extending from a front end of the sliding portion. Two inserting pins extend from the end plate through corresponding through holes of the rack post. The clipping member includes a first end fixed to the mounting bracket, and a second end approaching the end plate. A tab protrudes from the clipping member and is adjacent to the second end of the clipping member. The second end or the tab of the clipping member abuts against a side of rack post opposite to the end plate to avoid the inserting pins to disengage from the corresponding through holes.

7 Claims, 5 Drawing Sheets

MOUNTING APPARATUS FOR SLIDE RAIL

BACKGROUND

1. Technical Field

The present disclosure relates to mounting apparatuses and, more particularly, to a mounting apparatus for a slide rail.

2. Description of the Related Art

Traditionally, a slide rail is used between two objects that can move relative to each other, such as between a desk and a drawer, a server and a rack, etc.

A conventional slide rail assembly for a desk drawer includes an outer slide rail mounted to the desk, an inner slide rail mounted to the drawer, and an intermediate slide rail mounted between the outer and inner slide rails. The intermediate slide rail is extendable relative to the outer slide rail, and the inner slide rail is extendable relative to the intermediate slide rail, thus the drawer can be extended a distance out from the desk. Screws is used for mounting the outer slide rail to a bracket of the desk. Therefore, installing or uninstalling the outer slide rail is inconvenient and time-consuming.

DETAILED DESCRIPTION

Figure 1:
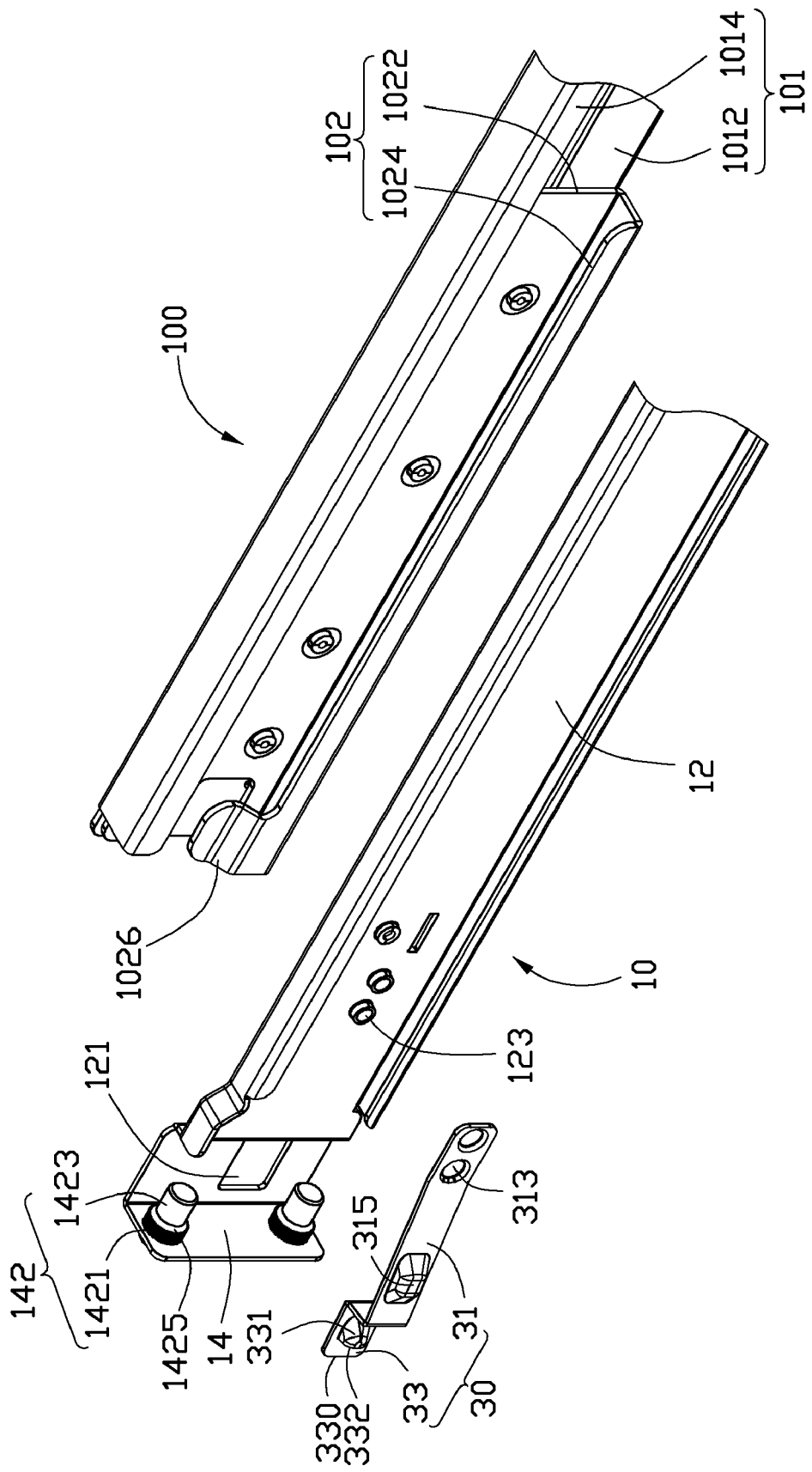
FIG. 1 is an exploded, isometric view of an embodiment of a mounting apparatus and a slide rail.
Figure 5:
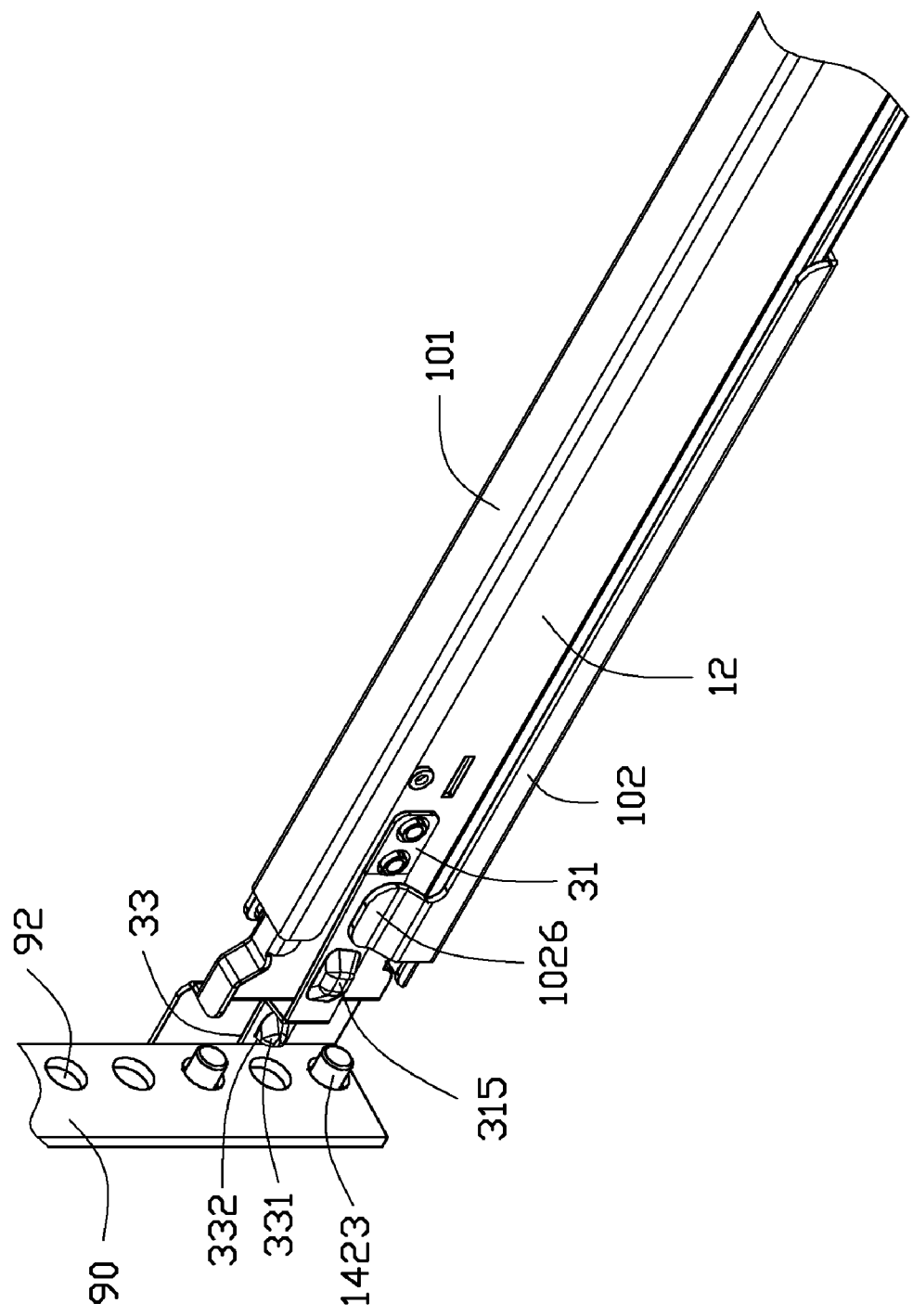
FIG. 5 shows the mounting apparatus and the slide rail of FIG. 2 being fixed to a second rack post.

Referring to FIG. 1, an embodiment of a mounting apparatus is provided for mounting a slide rail 100 to a component rack. The component rack may include a plurality of first rack posts 80 (shown in FIG. 3) defining a plurality of rectangular through holes 82, or a plurality of second rack posts 90 (shown in FIG. 5) defining a plurality of round through holes 92. The mounting apparatus includes a mounting bracket 10, and a clipping member 30 fixed to the mounting bracket 10.

The slide rail 100 includes a rail body 101 and a holding bar 102 fixed to the rail body 101. The rail body 101 includes a base wall 1012 and a sidewall 1014 extending from a top side of the base wall 1012. The holding bar 102 has a substantially U-shaped cross-section, and includes a connecting wall 1022 fixed to the base wall 1012, and a supporting wall 1024 extending outwards and then upwards from a bottom of the connecting wall 1022. A holding portion 1026 extends from a top side of the supporting wall 1024, adjacent to the front of the holding bar 102, and substantially parallel to the connecting wall 1022 of the holding bar 102.

The mounting bracket 10 includes an elongated sliding portion 12 and an end plate 14 extending outwards from a front end of the sliding portion 12. An accommodating opening 121 is defined in the sliding portion 12 adjacent to the end plate 14. Two protrusions 123 extend outwards from the sliding portion 12, adjacent to the accommodating opening 121. Two inserting pins 142 extend from a surface of the end plate 14 towards the sliding portion 12. Each of the inserting pins 142 includes a first inserting segment 1421 adjacent to the end plate 14, and a second inserting segment 1423 extending from the first inserting segment 1421. The first inserting segment 1421 can extend through one of the through holes 82 of the first rack post 80, but cannot pass through one of the through holes 92 of the second rack post 90. A diameter of the second inserting segment 1423 is smaller than a diameter of the first inserting segment 1421 to enable the second inserting segment 1423 to extend through either one of the through holes 82 of the first rack post 80, or one of the through holes 92 of the second rack post 90. A shoulder 1425 is formed at an end of the first inserting segment 1421 facing the second inserting segment 1423.

The clipping member 30 is a spring plate, and includes an extension segment 31, and a stopping segment 33 extending from a front end of extension segment 31. A stop is formed between the extension segment 31 and the stopping segment 33. The extension segment 31 is arc-shaped, with a middle of the extension segment 31 protruding inwards. The extension segment 31 defines two fixing holes 313 adjacent to a rear end of the extension segment 31 opposite to the stopping segment 33. A touch portion 315 protrudes outwards from the extension segment 31, adjacent to the front end of the extension segment 31. A first stopping point 330 is formed on a free end of the stopping segment 33 opposite to the extension segment 31. A tab 331 protrudes outwards from the stopping segment 33. A second stopping point 332 is formed on a front end of the tab 331.

Figure 2:
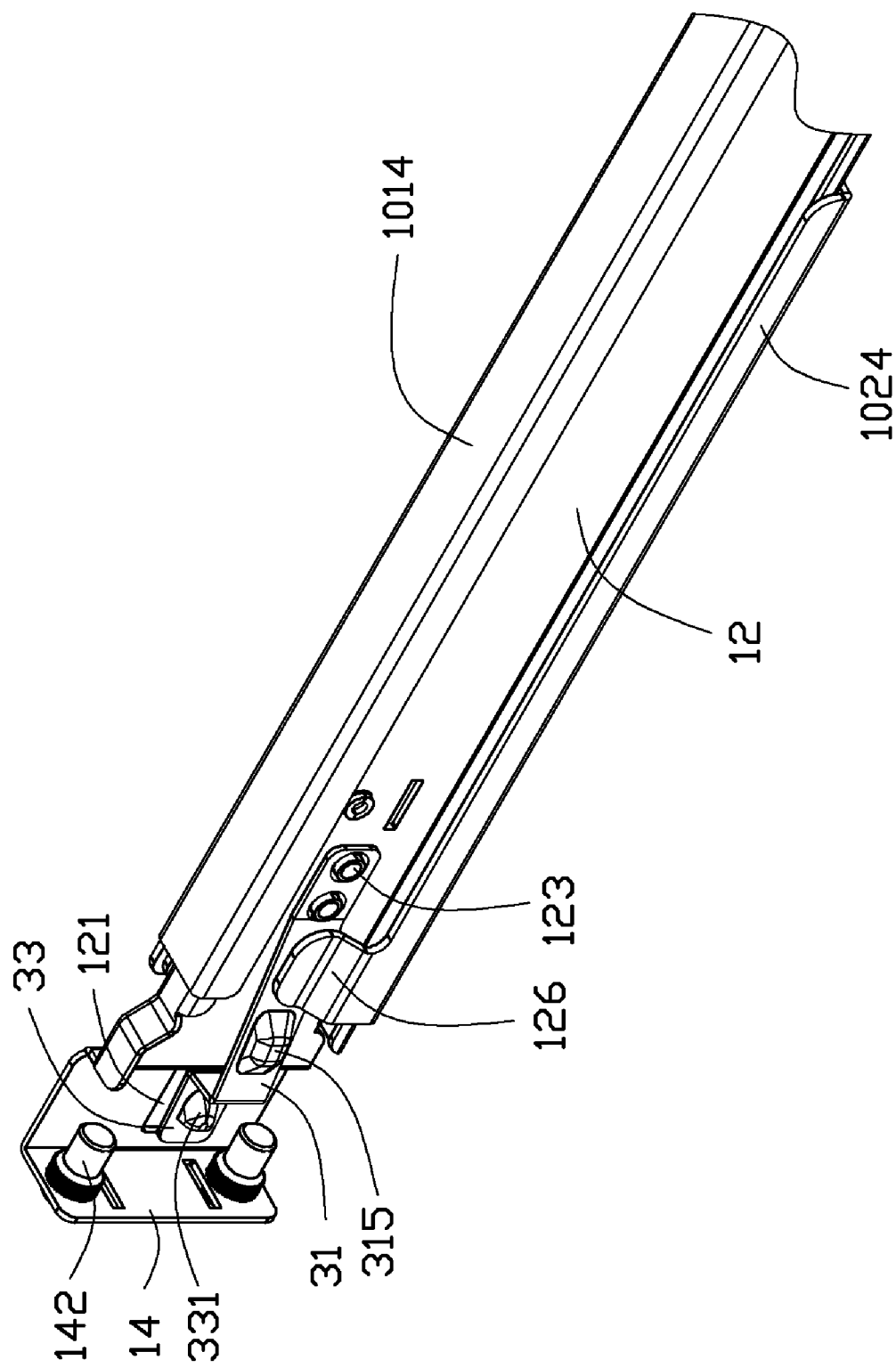
FIG. 2 is an assembled view of FIG. 1.

Referring to FIG. 2, in assembly, the clipping member 30 is fixed to the mounting bracket 10, with the protrusions 123 of the mounting bracket 10 engaged in the fixing holes 313 of the clipping member 30. The stopping segment 33 of the clipping member 30 is aligned with the accommodating opening 121. A distance between the first stopping point 330 of the clipping member 30 and the end plate 14 of the mounting bracket 10 is smaller than a distance between the shoulders 1425 of the inserting pins 142 and the end plate 14 of the mounting bracket 10. A distance between the second stopping point 332 of the clipping member 30 is disposed between and the end plate 14 of the mounting bracket 10 is greater than a distance between the shoulders 1425 of the inserting pins 142 and the end plate 14 of the mounting bracket 10. In other words, a distance between the first stopping point and the end plate is shorter than a distance between the second stopping point and the end plate. Due to the arced shape of the extension segment 31 of the clipping member 30, the stopping segment 33 of the clipping member 30 is biased to move away from the mounting bracket 10. The mounting apparatus is mounted to the slide rail 100, with the sliding portion 12 slidably engaged between the sidewall 1014 of the rail body 101 and the supporting wall 1024 of the holding bar 102 of the slide rail 100.

Figure 3:
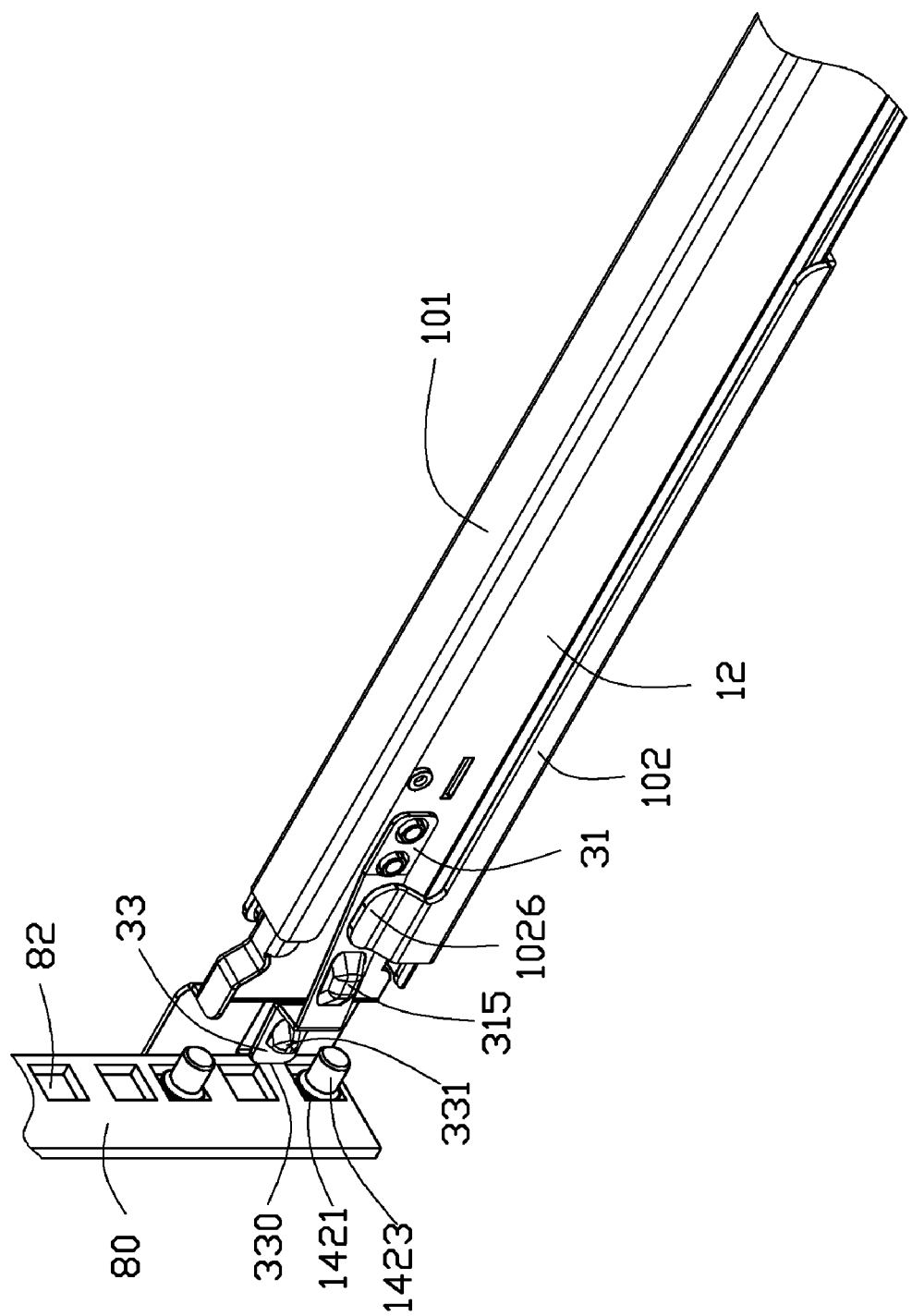
FIG. 3 shows the mounting apparatus and the slide rail of FIG. 2 being fixed to a first rack post.
Figure 4:
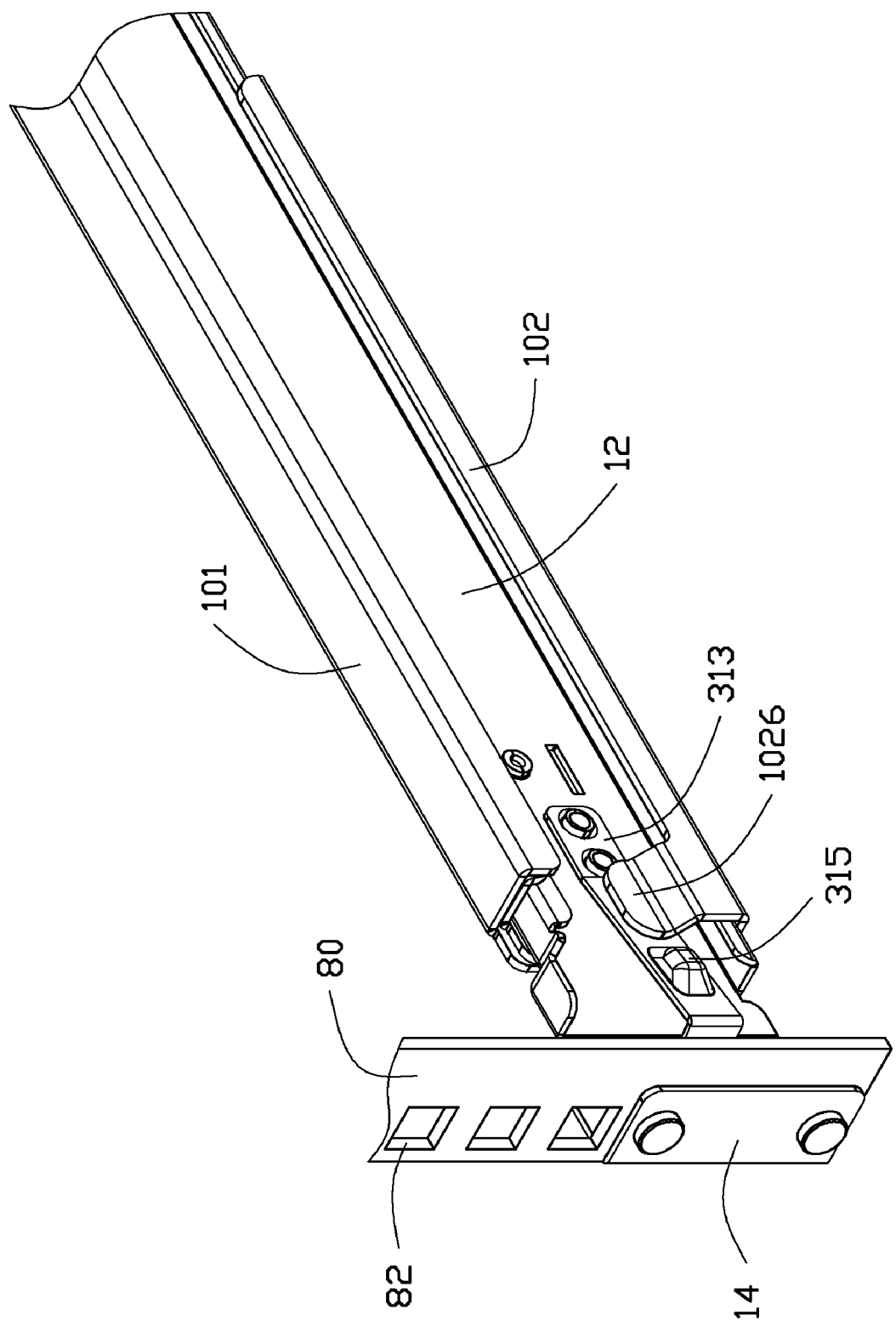
FIG. 4 is similar to FIG. 3, but shown from a different perspective.

Referring to FIGS. 3 and 4, to mount the slide rail 100 to the component rack with the first rack posts 80, the mounting bracket 10 is slid forward relative to the slide rail 100, until the touch portion 315 of the clipping member 30 resists against a side of the holding portion 1026 of the holding bar 100 facing the rail body 101 of the slide rail 100. Therefore, the clipping member 30 is deformed to make the stopping segment 33 engage in the accommodating opening 121 of the mounting bracket 10. The slide rail 100 is manipulated to insert the inserting pins 142 of the mounting bracket 10 into the corresponding through holes 82 of the first rack post 80, and make the end plate 14 abut against a front side of the first rack post 80. Because the mounting bracket 10 is stopped by the first rack post 80, the slide rail 100 is driven backwards to make the slide rail 100 slide relative to the mounting bracket 10 to make the holding portion 1026 of the holding bar 102 disengage from the touch portion 315 of the clipping member 30. The clipping member 30 restores to make the first stopping point 330 of the clipping member 30 abut against a back side of the first rack post 80. Therefore, the mounting bracket 10 is prevented from moving forwards, thereby to avoid the inserting pins 142 disengaging from the corresponding through holes 82 of the first rack post 80.

To detach the slide rail 100 from the first rack post 80, the slide rail 100 is slid forwards to cause a relative sliding between the slide rail 100 and the mounting bracket 10, until the touch portion 315 of the clipping member 30 resists against the holding portion 1026 of the holding bar 102 of the slide rail 100. The clipping member 30 is deformed to make the stopping segment 33 offset from the first rack post 80, to enable the mounting bracket 10 to move forwards and enable the inserting pins 142 to disengage from the corresponding through holes 82 of the first rack post 80. Therefore, the slide rail 100 is ready for being detached from the first rack post 80.

To mount the slide rail 100 to the component rack with the second rack posts 90, the slide rail 100 is manipulated to insert the inserting pins 142 of the mounting bracket 10 into the corresponding through holes 92 of the second rack post 90, with the shoulders 1425 the inserting pins 142 abutting against a front side of the second rack post 90. Because the mounting bracket 10 is stopped by the second rack post 90, the slide rail 100 is driven backwards to make the slide rail 100 slide relative to the mounting bracket 10, so as to make the holding portion 1026 of the holding bar 102 disengage from the touch portion 315 of the clipping member 30. The clipping member 30 restores to make the second stopping point 332 of the clipping member 30 abut against a back side of the second rack post 90. Therefore, the mounting bracket 10 is prevented from moving forwards, thereby avoiding the inserting pins 142 disengaging from the corresponding through holes 92 of the second rack post 90.

It is believed that the present embodiment and its advantages will be understood from the foregoing description, and it will be apparent that various changes may be made thereto without departing from the spirit and scope of the description or sacrificing all of its material advantages, the examples hereinbefore described merely being exemplary embodiments.

What is claimed is:

1. A mounting apparatus for mounting a slide rail to a rack post of a component rack, the rack post defining a plurality of through holes, the mounting apparatus comprising:
    a mounting bracket comprising a sliding portion for slidably engaging with the slide rail, an end plate extending from an end of sliding portion in a direction perpendicular to a sliding direction of the slide rail, and an inserting pin extending from the end plate; and
    a clipping member attached to the mounting bracket, and integrally forming a first stopping point and a second stopping point, a distance between the first stopping point and the end plate being smaller than a distance between the second stopping point and the end plate;
    wherein the inserting pin is operable to be inserted into one of the through holes of the rack post, the clipping member is operable to make one of the first stopping point and the second stopping point abut against a side of the rack post opposite to the end plate of the mounting bracket, to prevent the inserting pin from disengaging from the corresponding through hole of the rack post;
    wherein the clipping member is a spring plate comprising an extension segment with a first end fixed to the sliding portion of the mounting bracket, and a stopping segment extending from a second end of the extension segment, the stopping segment is adjacent to the end plate of the mounting bracket, and integrally forms a tab, the first stopping point is formed on a distal end of the stopping segment, the second stopping point is formed on the tab;
    wherein the inserting pin comprises a first inserting segment adjacent to the end plate, and a second inserting segment extending from the first inserting segment away from the end plate, the first inserting segment has a diameter greater than a diameter of the second inserting segment, a shoulder is formed at an end of the first inserting segment facing the second inserting segment, a distance between the first stopping point and the end plate of the mounting bracket is smaller than a distance between the shoulder of the inserting pin and the end plate of the mounting bracket, a distance between the second stopping point and the end plate of the mounting bracket is greater than a distance between the shoulder of the inserting pin and the end plate of the mounting bracket; and
    wherein the first stopping point abuts against the rack post in response to the first inserting segment of the inserting pin extending through one of the through holes of the rack post, the second stopping point abuts against the rack post in response to the second inserting segment of the inserting pin extending through one of the through holes of the rack post and the shoulder of the inserting pin abutting against the rack post.

2. The mounting apparatus of claim 1, wherein the stopping segment is movable between a latching position, where one of the first stopping point and the second stopping point abuts against the rack post, and an unlatching position where the stopping segment is offset from the rack post.

3. The mounting apparatus of claim 2, wherein the stopping segment tends to the latch position under elasticity of the clipping member.

4. The mounting apparatus of claim 2, wherein the sliding portion of the mounting bracket defines an accommodating opening to receive the stopping segment in response to the stopping segment moving to the unlatching position.

5. An assembly comprising:
    a rack post defining a plurality of through holes;
    a slide rail comprising a rail body and a holding bar fixed to the rail body;
    a mounting bracket comprising a sliding portion slidably engaged between the rail body and the holding bar, an end plate extending from an end of the sliding portion in a direction perpendicular to a sliding direction of the slide rail, and an inserting pin extending from the end plate through one of the through holes of the rack post; and
    a clipping member attached to the mounting bracket, and comprising at least one stopping point abutting against a side of the rack post opposite to the end plate of the mounting bracket;
    wherein the rail body comprising a base wall and a side wall extending from a top side of the base wall, the holding bar comprises a connecting wall fixed to the base wall of the rail body and a supporting wall extending from a bottom of the connecting wall, the sliding portion of the mounting bracket slidable between the sidewall of the rail body and the support wall of the holding bar;
    wherein a holding portion extends from a top side of the supporting wall, the clipping member is offset from the rack post in response to the mounting bracket sliding relative to the slide rail to an unlocking position, where the clipping member engages with the holding portion of the holding bar of the slide rail.

6. The assembly of claim 5, wherein the at least one stopping point comprises a first stopping point and a second stopping point, a distance between the first stopping point and the end plate is smaller than a distance between the second stopping point and the end plate, the inserting pin comprises a first inserting segment adjacent to the end plate, and a second inserting segment extending from the first inserting segment away from the end plate, the first inserting segment has a diameter greater than a diameter of the second inserting segment, a shoulder is formed at an end of the first inserting segment facing the second inserting segment, the second stopping point abuts against the rack post in response to the rack post abutting against the shoulder and the second inserting segment of the inserting pin extending through the through hole of the rack post, the first stopping point abuts against the rack post in response to the first inserting segment of the inserting pin extending through the through hole of the rack post.

7. The assembly of claim 6, wherein the clipping member is a spring plate comprising a first end fixed to the sliding portion of the mounting bracket, and a second end approaching the end plate of the mounting bracket, a tab protrudes from the clipping member and is adjacent to a second end of the clipping member, the first stopping point is formed on the second end of the clipping member, and the second stopping point is formed on the tab of the clipping member.

\* \* \* \* \*